(12) United States Patent
Leng

(10) Patent No.: US 11,101,208 B2
(45) Date of Patent: Aug. 24, 2021

(54) METAL-INSULATOR-METAL (MIM) CAPACITOR

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/741,921

(22) Filed: Jan. 14, 2020

(65) Prior Publication Data

US 2021/0043560 A1    Feb. 11, 2021

Related U.S. Application Data

(60) Provisional application No. 62/882,690, filed on Aug. 5, 2019.

(51) Int. Cl.
*H01L 23/522*    (2006.01)
*H01L 49/02*    (2006.01)
(Continued)

(52) U.S. Cl.
CPC .......... *H01L 23/5222* (2013.01); *H01L 23/48* (2013.01); *H01L 23/5228* (2013.01);
(Continued)

(58) Field of Classification Search
CPC . H01L 23/5222; H01L 23/48; H01L 23/5228; H01L 23/53228; H01L 28/40; H01L 28/86; H01L 28/90; H01L 28/92
See application file for complete search history.

(56) References Cited

U.S. PATENT DOCUMENTS 6,569,746 B2 * 5/2003 Lee ............... H01L 27/0805
                                                    257/E21.009
6,818,936 B2 * 11/2004 Lin ..................... H01L 28/40
                                                    257/300
(Continued)

FOREIGN PATENT DOCUMENTS

| JP | 2006216728 A | 8/2006 | .......... H01L 21/3205 |
| JP | 2007214284 A | 8/2007 | .......... H01L 21/768 |
| JP | 2008147300 A | 6/2008 | .......... H01L 21/318 |

OTHER PUBLICATIONS

International Search Report and Written Opinion, Application No. PCT/US2020/13990, 12 pages, dated May 4, 2020.
(Continued)

*Primary Examiner* — Peniel M Gumedzoe
(74) *Attorney, Agent, or Firm* — Slayden Grubert Beard PLLC

(57) ABSTRACT

A process of forming a metal-insulator-metal (MIM) capacitor may be incorporated into a process of forming metal bond pads connected directly to a top metal interconnect layer (e.g., Cu MTOP). The MIM capacitor may include a dielectric layer formed between a bottom plate defined by the Cu MTOP and a top plate comprising an extension of, or connected directly to, a metal bond pad formed above the Cu MTOP. The process of forming the MIM capacitor may include etching an opening in a passivation layer formed over the Cu MTOP to expose a top surface of the Cu MTOP, forming a dielectric layer extending into the passivation layer opening and onto the exposed Cu MTOP surface, removing portions of the dielectric layer to define a capacitor dielectric, and depositing bond pad metal extending into the passivation layer opening and onto the capacitor dielectric, to define the MIM capacitor top plate.

17 Claims, 4 Drawing Sheets

(51) Int. Cl.
*H01L 23/532* (2006.01)
*H01L 23/48* (2006.01)
*H01L 23/00* (2006.01)

(52) U.S. Cl.
CPC ........ *H01L 23/53228* (2013.01); *H01L 24/05* (2013.01); *H01L 28/40* (2013.01)

(56) References Cited

U.S. PATENT DOCUMENTS

| | | | |
|---|---|---|---|
| 6,924,206 B2* | 8/2005 | Ozawa | H01L 21/768 257/E21.008 |
| 7,169,665 B2* | 1/2007 | Lin | H01L 23/5223 257/E21.008 |
| 2006/0024899 A1 | 2/2006 | Crenshaw et al. | 438/381 |
| 2006/0197183 A1 | 9/2006 | Yang et al. | 257/532 |
| 2006/0223276 A1 | 10/2006 | Lin et al. | 438/393 |
| 2008/0203531 A1 | 8/2008 | Imai et al. | 257/535 |
| 2009/0147438 A1* | 6/2009 | Nishiura | H01L 28/75 361/305 |
| 2012/0112314 A1 | 5/2012 | Jou et al. | 257/532 |

OTHER PUBLICATIONS

Ng, Chit Hwei et al., "MIM Capacitor Integration for Mixed-Signal/RF Applications," IEEE Transactions on Electron Devices, vol. 52, No. 7, pp. 1399-1409, dated Jul. 2005.

\* cited by examiner

METAL-INSULATOR-METAL (MIM) CAPACITOR

RELATED APPLICATION

This application claims priority to commonly owned U.S. Provisional Patent Application No. 62/882,690 filed Aug. 5, 2019, the entire contents of which are hereby incorporated by reference for all purposes.

TECHNICAL FIELD

The present disclosure relates to metal-insulator-metal (MIM) capacitors, and more particularly, to MIM capacitors built on copper interconnect.

BACKGROUND

A metal-insulator-metal (MIM) capacitor is a capacitor constructed with a metal top plate, a metal bottom plate, and an insulator (dielectric) sandwiched between the two metal plates.

MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (Poly-Oxide-Poly) capacitors and MOM (Metal-Oxide-Metal Lateral Flux) capacitors, due to lower resistance, better matching, and/or better signal/noise ratio.

MIM capacitors are typically provided built just below the top metal layer, for example, using the existing Top-1 Metal layer as the bottom plate, constructing a top plate with a different metal (e.g., Ti/TiN, Ta/TaN, W), and connecting an overlying Top Metal layer to the top and bottom plates of the capacitor through respective vias.

FIGS. 1A and 1B show two examples of conventional MIM capacitor structures. FIG. 1A shows a conventional MIM capacitor 10A built on an aluminum interconnect. MIM capacitor 10A includes an insulator layer 12A formed between an aluminum bottom plate 14A (Top-1 Metal layer) and a metal top plate 16A (e.g., Ti, TiN, or Al). The Al bottom plate 14A and metal top plate 16A are each connected to a respective contact 20A and 22A (Top Metal layer) by one or more vias 24A and 26A, e.g., each formed by filling a via hole with tungsten (W) or other suitable metal. The insulator layer 12A may be an SiN layer having a thickness of about 500 Å, for example.

FIG. 1B shows another conventional MIM capacitor 10B built on a copper (Cu) interconnect. MIM capacitor 10B includes an insulator layer 12B formed between a Cu bottom plate 14B (Top-1 Metal layer) and a metal top plate 16B (e.g., Ta, TaN, or TiN). The Cu bottom plate 14B and metal top plate 16B are each connected to a respective contact 20B and 22B (Top Metal layer) by one or more vias 24B and 26B, e.g., each formed by filling a via hole with copper or other suitable metal. As with capacitor 10A built on Al interconnect, the insulator layer 12B of capacitor 10B built on Cu interconnect may be an SiN layer having a thickness of about 500 Å, for example. Layer 12B also acts as a dielectric diffusion barrier for the copper of bottom plate 14B.

As used herein, a "via" refers to a conductive via formed by plugging or otherwise depositing a conductive material (e.g., tungsten) in a via hole having a small diameter or width, e.g., a diameter or width below 1 μm, and thus having a relative large resistance, e.g., a resistance of at least 1 ohm per via. For example, conventional vias (e.g., vias 24A, 26A, 24B, and/or 26B shown in FIGS. 1A and 1B) typically have a small diameter in the range of 0.1 μm to 0.5 μm, and may have a resistance of about 10 ohms/via, for example, especially for vias formed from tungsten or other highly resistive material. Thus, conventional MIM capacitors often include multiple vias (e.g., multiple vias between the top plate and top plate contact and/or multiple vias between the bottom plate and bottom plate contact) to reduce the overall resistance to some extent. However, the number of vias that can be formed in parallel is limited by physical or process related constraints, for example due to dishing/erosion of vias resulting from a CMP process on conformally filled tungsten vias. Further, as used herein, a "via connection" in the context of an MIM capacitor refers to a via extending from a capacitor plate (top plate or bottom plate) to an overlying conductive contact.

In addition, in MIM capacitors, the resistance of each of the top plate and bottom plate typically impacts the MIM capacitor performance, particularly when used in RF applications. In addition, MIM capacitors are typically expensive to build, e.g., as compared with other certain types of capacitors. For example, MIM capacitors typically require additional mask layers and many additional process steps, as compared with POP (Poly-Oxide-Poly) capacitors and MOM (Metal-Oxide-Metal Lateral Flux) capacitors.

There is a need for MIM capacitors that can be manufactured at lower cost, and with improved performance.

SUMMARY

Embodiments of the present invention provide a metal-insulator-metal (MIM) capacitor incorporated in an integrated circuit structure in which metal bond pads (e.g., Al bond pads) are formed directly connected to an interconnect metal layer (e.g., Cu MTOP layer). The MIM capacitor may include a dielectric layer formed between a bottom plate defined by the Cu MTOP layer and a top plate defined by a portion of metal bond pad material extending contiguously from (below) a metal bond pad.

Some embodiments provide a process of forming such MIM capacitor, which may include etching an opening in a passivation region formed over the Cu MTOP layer to expose a top surface of the Cu MTOP layer, forming a dielectric layer extending into the passivation region opening and onto the exposed Cu MTOP surface, using a photoresist "cap" to selectively remove portions of the dielectric layer to define a capacitor dielectric layer, and depositing bond pad metal extending into the passivation region opening and onto the capacitor dielectric, to define the MIM capacitor top plate.

Thus, some embodiments provide a MIM capacitor built on copper interconnects without via connections, which may reduce cost and provide an improved capacitor as compared with conventional MIM capacitors. In addition, the dielectric layer of the MIM capacitor may be formed with edges that turn up and extend vertically from a horizontal region, which may define corners that improve break-down voltage.

BRIEF DESCRIPTION OF THE FIGURES

A more complete understanding of the present disclosure may be acquired by referring to the following description taken in conjunction with the accompanying drawings wherein.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present invention incorporate an MIM capacitor into an IC structure in which bond pads (e.g., aluminum bond pads) are formed directly connected to metal interconnect structures (e.g., Cu interconnect), e.g., rather than using conductive vias. For example, some embodiments incorporate the formation of an MIM capacitor into a process of forming aluminum bond pads connected directly to a top interconnect layer by a lower extension of the bond pad material. The top interconnect layer is referred to herein as the top metal interconnect layer or "MTOP" layer, or "Cu MTOP" layer in the case of copper interconnect.

Figure 1A:
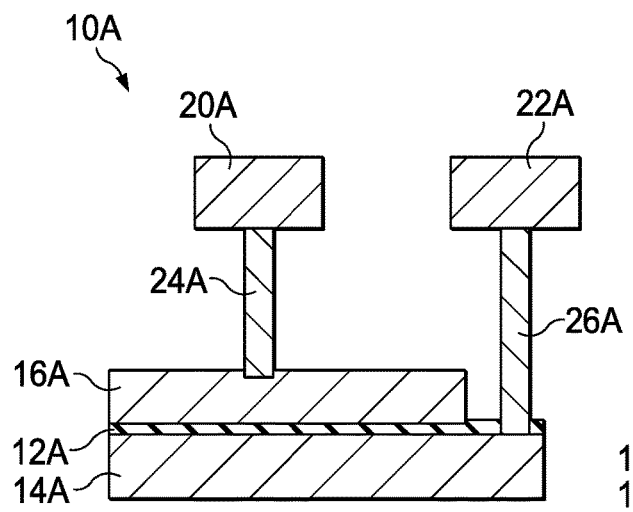
FIG. 1A shows a conventional MIM capacitor built on an aluminum interconnect.
Figure 1B:
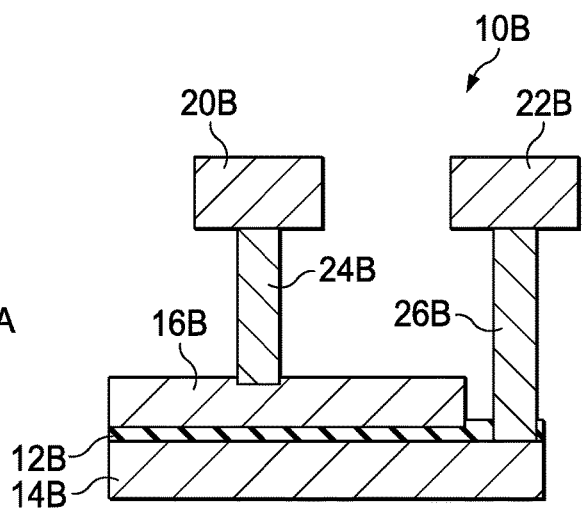
FIG. 1B shows a conventional MIM capacitor built on a copper interconnect.
Figure 2A:
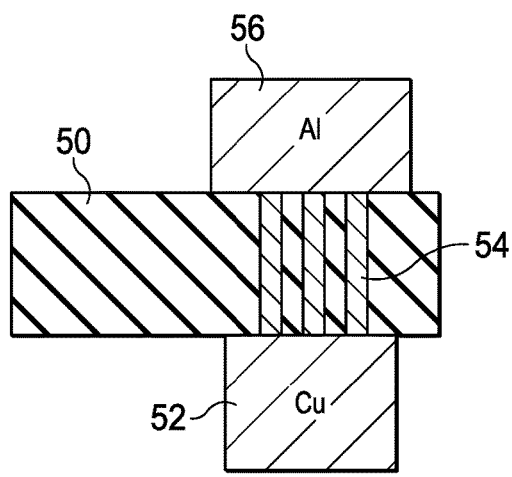
FIG. 2A is a cross-sectional view showing a conventional approach for connecting a bond pad to a Cu MTOP layer with conductive vias passing through a passivation layer.

The typical conventional approach of forming bond pads connected to metal interconnects, for example to form Al bond pads connected to Cu MTOP layer for compatibility with legacy packaging, involves forming conductive vias extending vertically through a passivation layer formed over the Cu MTOP layer, and forming the Al bond pads on the conductive vias, such that the Al bond pads are connected to the Cu MTOP layer by the conductive vias. FIG. 2A is a cross-sectional view showing this conventional approach, wherein a passivation layer 50 is formed over a Cu MTOP layer 52, vias 54 are formed in etched openings in the passivation layer 50, and Al bond pads 56 are formed on the vias 54.

Figure 2B:
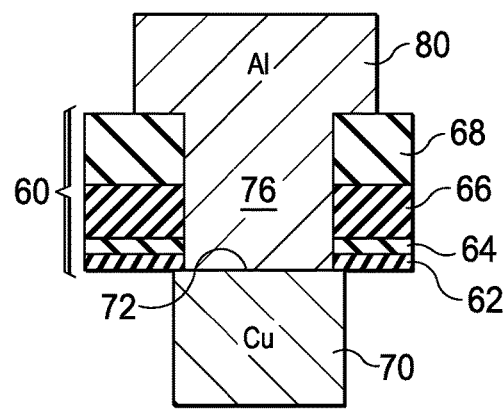
FIG. 2B is a cross-sectional view showing an example of a bond pad connected directly to a Cu MTOP layer by an extension of the bond pad material, rather than using vias.

In contrast, Microchip Inc. having a headquarters in Chandler, Ariz has developed an approach for forming bond pads connected directly to the Cu MTOP layer by an extension of the bond pad material itself, rather than using vias to connect the bond pads to the underlying Cu MTOP. FIG. 2B is a cross-sectional view showing an example of this approach.

A multi-layer passivation region 60 is formed over the Cu MTOP layer 70. The multi-layer passivation region 60 may include any number and types of layers suitable to form a passivation region. In one embodiment, multi-layer passivation region 60 includes four layers: a 1,000 Å SiN layer 62, a 1,000 Å silicon rich oxide (SRO) layer 64, a 6,800 Å phosphosilicate glass (PSG) layer 66, and a 5,900 Å SiON layer 68. A first pattern and etch process is performed to form an opening through the passivation region 60 and expose a top surface 72 of the Cu MTOP layer 70. Al pad metal is then deposited over the structure, such that a lower portion 76 of the Al pad metal extends down into the opening in the passivation region 60 and onto the exposed top surface 72 of Cu MTOP layer 70. The upper portion of the deposited Al (above the passivation region 60) may then be patterned and etched to define a number of Al bond pads 80.

The inventor has discovered that the process and structure of forming bond pads connected directly to the MTOP layer, e.g., as shown in FIG. 2B, provides a desirable location for building an MIM capacitor, in which the bottom plate is defined by the MTOP layer (e.g., Cu MTOP), the top plate is defined by the bond pad material extending down toward the MTOP, and no via connection is needed. In some embodiments, the top and bottom plates of the inventive MIM capacitor may each connect directly to top-side bond pads, or may be connect downwardly to lower level interconnects through an existing interconnect network.

Figure 3:
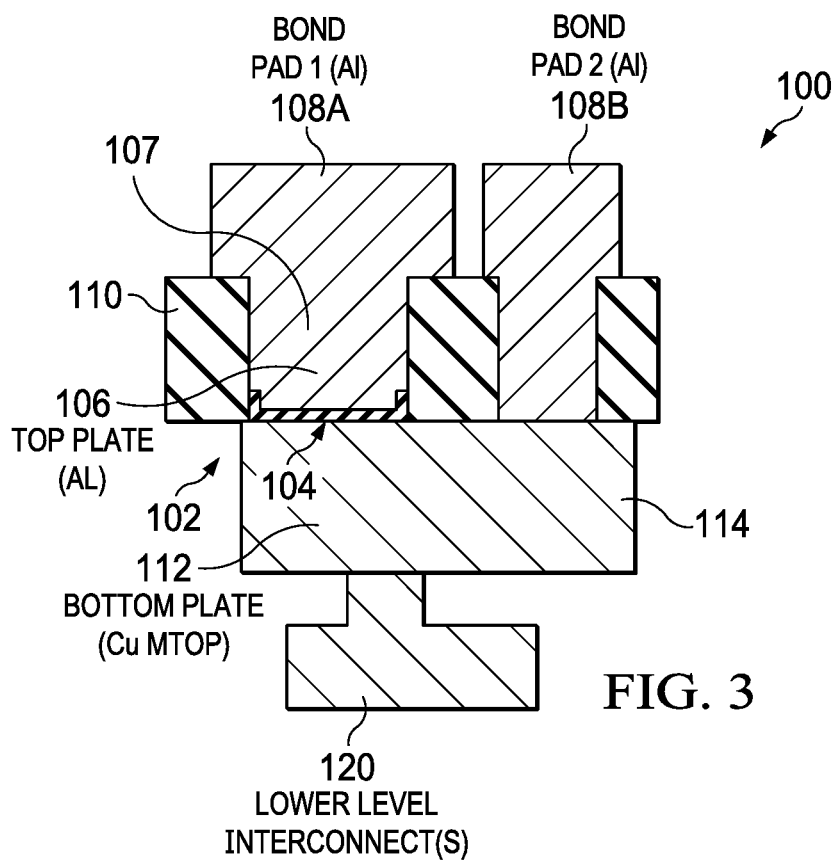
FIG. 3 is a cross-sectional view of an example integrated circuit structure including an MIM capacitor, according to embodiments of the present invention.

FIG. 3 shows an example integrated circuit structure 100 including an MIM capacitor 102, according to embodiments of the present invention. As shown, structure 100 may include a first Al bond pad 108A (Bond Pad 1) and a second Al bond pad 108B (Bond Pad 2) formed over a Cu MTOP layer 114. The MIM capacitor 102 includes an insulation layer 104 formed between (a) a top plate 106 defined by a lower portion 107 (e.g., a lower extension) of the Al bond pad material (Bond Pad 1) and (b) a bottom plate 112 defined by a portion of the Cu MTOP layer 114. The lower portion 107 of the Al bond pad 108A (Bond Pad 1) defining the top plate 106 may comprise a portion of the Al bond pad material extending down into an opening formed in a passivation layer or region 110, e.g., as discussed above with respect to FIG. 2B.

Thus, as shown in FIG. 3, to contact the MIM capacitor 102 to respective bond pads, the top plate 106 may be contiguous with (e.g., as a physical extension of) the Al bond pad 108A (Bond Pad 1), and the bottom plate 112 may connect directly to another Al bond bad 108B (Bond Pad 2), or alternatively may connect to lower level interconnect(s) or other lower level structures 120. Thus, MIM capacitor 102 may connect to both Al bond pad 108A and Al bond bad 108B without via connections.

Each of the top plate 106 and bottom plate 112 may have any cross-sectional shape, e.g., square, rectangular, circular, or oval. In some embodiments, each of top plate 106 and/or bottom plate 112 may have a diameter or width in the range between 1 μm and 100 μm. In some embodiments, the top plate resistance is below 1 ohm per square, e.g., in the range of 0.008-0.1 ohm per square, which is substantially lower (e.g., by at least 2 or 3 orders of magnitude) than resistance provided by via connections of conventional designs.

As discussed in detail below, in some embodiments the inventive MIM capacitor, e.g., MIM capacitor 102 as shown in FIG. 3, may be formed with only four additional process steps added to an existing process for forming a structure as shown in FIG. 2B: (1) a SiN deposition step, (2) a photoresist patterning step (e.g., i-line pattern), (3) a SiN etch step, and (4) a resist strip step. Thus, the inventive MIM capacitor may be formed in a cost effective manner.

Thus, one aspect of the invention provides a metal-insulator-metal (MIM) capacitor including a bottom plate defined by a copper interconnect, a dielectric layer formed on the bottom plate, and a top plate formed on the dielectric layer, wherein the top plate is defined by a lower portion (e.g., a lower extension) of a metal bond pad or is otherwise connected directly to the bottom of a metal bond pad without via connections. In some embodiments, the top plate is an extension of or connected directly to an aluminum bond pad by a direct metal-metal connection, with a top plate diameter or width substantially larger than conventional vias, thus providing a substantially lower resistance (e.g., by at least 2 or 3 orders of magnitude) than conventional designs. For example, in some embodiments, the top plate comprises a lower extension of a bond pad or is otherwise directly connected to the bond pad by direct metal-metal contact, and has a diameter or width in the range between 1 μm and 100 μm. In some embodiments, the resistance is limited by sheet resistance of metal. In some embodiments, the top plate resistance is below 1 ohm per square, e.g., in the range of 0.008-0.1 ohm per square, which is substantially lower than via connections of conventional designs. The top plate may have any cross-sectional shape, e.g., square, rectangular, circular, or oval.

Further, in some embodiments, the MIM capacitor includes a passivation region or layer between the bottom plate and the metal bond pad, and the top plate is defined by metal bond pad material extending down into an opening formed in the passivation region.

In some embodiments, the copper interconnect defining the bottom plate comprises a portion of a top-most damascene copper layer of an integrated circuit device. In some embodiments, the metal bond pad comprises an aluminum bond pad, and the top plate is defined by a region of aluminum extending continuously down from the aluminum bond pad. In some embodiments, both the top plate and the bottom plate are low resistance (thick metal), which may be particularly suitable for certain RF applications. For example, the bottom plate may have a Copper thickness about 0.34 μm, e.g., in the range of 0.3 μm to 2.0 μm, with a corresponding sheet resistance in the range of 8-70 milliohms per square; and the top plate may have an aluminum thickness of about 1.5 μm, e.g. in the range of 0.85 μm to 4.0 μm, with corresponding sheet resistance in the range of 8-55 milliohms per square.

In some embodiments, the dielectric layer comprises SiN. In addition, in some embodiments, the dielectric layer comprises a laterally-extending bottom region and at least one vertically-extending sidewall extending upwardly from at least one edge of the laterally-extending bottom region, which may provide an improved break-down voltage of the MIM capacitor.

Another aspect of the invention provides an integrated circuit device, including a plurality of electronic devices; a first metal bond pad connected to a first top metal interconnect directly by material of the first metal bond pad, without via connections (e.g., without forming via connections as shown in prior art FIG. 2A, for example); and a metal-insulator-metal (MIM) capacitor, for example formed laterally offset from the first metal bond pad connected to the first top metal interconnect. The MIM capacitor includes a capacitor bottom plate defined by a second top metal interconnect, a dielectric layer formed on the capacitor bottom plate, and a capacitor top plate formed on the dielectric layer, the capacitor top plate comprising a lower extension of a second metal bond pad, such that the capacitor bottom plate and the capacitor top plate are connected to the first and second metal bond pads, respectively, without via connections.

Another aspect of the invention provides a method of forming a metal-insulator-metal (MIM) capacitor, including: forming a copper interconnect layer including a copper region defining a bottom plate; forming a passivation region over the copper bottom plate; etching an opening in the passivation region that exposes a top surface of the copper bottom plate; forming a dielectric layer over the passivation region and extending into the opening in the passivation region and onto the exposed top surface of the defined bottom plate; removing portions of the dielectric layer to define a capacitor dielectric; and depositing a metal extending into the opening in the passivation region and onto the defined capacitor dielectric, to define a top plate of the MIM capacitor.

In some embodiments, the step of depositing the metal includes depositing (a) a first portion extending into the opening in the passivation layer and onto the capacitor dielectric to define the top plate of the MIM capacitor and (b) a second portion located above the passivation region and defining at least one bond pad, such that the first portion of the bond pad metal extends continuously from, and below, the second portion of the bond pad metal.

In some embodiments, forming the copper interconnect layer including the copper region defining the bottom plate comprises forming a damascene copper layer of an integrated circuit device.

In some embodiments, the deposited metal comprises aluminum. In some embodiments, both the capacitor top plate and the capacitor bottom plate have a thickness providing a low resistance, for example a resistance of less than 100 milliohms per square, in some embodiments, in the range of 8 to 70 milliohms per square. In some embodiments, the dielectric layer comprises SiN.

In some embodiments, the step of removing portions of the dielectric layer to define the capacitor dielectric comprises removing portions of the dielectric layer to define a capacitor dielectric comprising a laterally-extending bottom region and at least one vertically-extending sidewall extending upwardly from at least one edge of the laterally-extending bottom region, to thereby define at least one upwardly-extending corner that provides an improved break-down voltage of the MIM capacitor.

In some embodiments, the step of removing portions of the dielectric layer to define the capacitor dielectric includes depositing a photoresist to cover selected portions of the dielectric layer, and performing an etch to remove portions of the dielectric layer not covered by the photoresist material, thereby leaving a cap-shaped or bowl-shaped capacitor dielectric layer including a laterally-extending bottom region and at least one vertically-extending sidewall extending upwardly from at least one edge of the laterally-extending bottom region.

FIGS. 4A-4E illustrate an example process for forming an MIM capacitor according to one embodiment of the invention. Each FIG. 4A-4E shows cross-sectional views at two locations of an integrated circuit structure 200 under construction, namely a first location (labelled "Bond Pad") at which an Al bond pad is formed connected to a Cu MTOP layer 202, e.g., as shown in FIG. 2B, and a second location (labelled "MIM Capacitor") at which an MIM capacitor is formed according to the present invention.

Figure 4A:
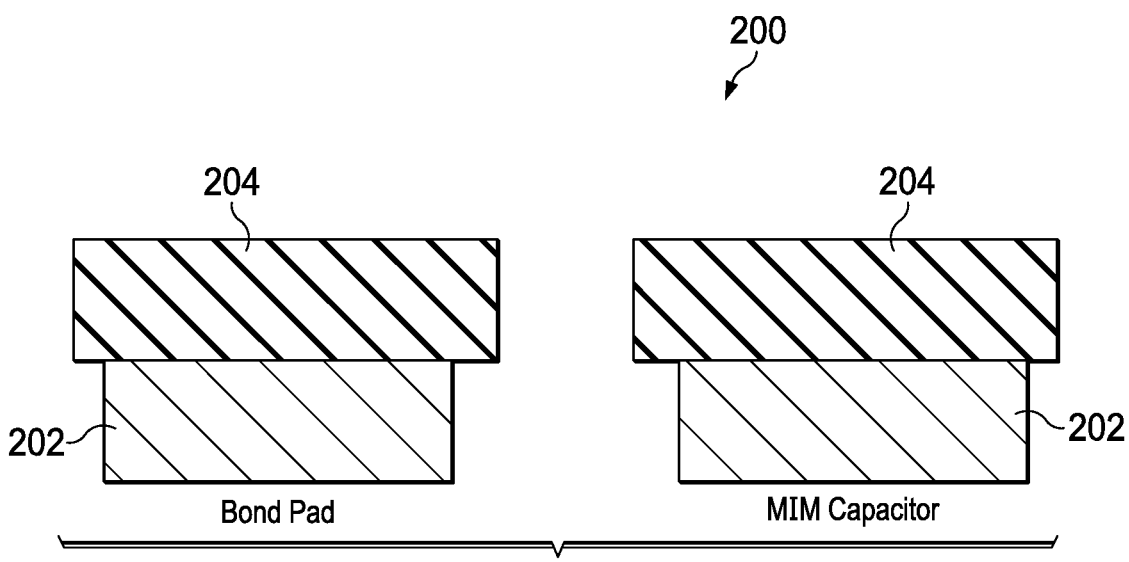
FIGS. 4A-4E are cross-sectional views illustrating an example process for forming an MIM capacitor according to one embodiment of the invention.

First, as shown in FIG. 4A, after forming a Cu top metal layer (Cu MTOP layer) 202, a top metal copper chemical mechanical planarization (CMP) is performed, and a passivation region 204 (including one or more passivation layers) is deposited over Cu MTOP layer 202.

Figure 4B:
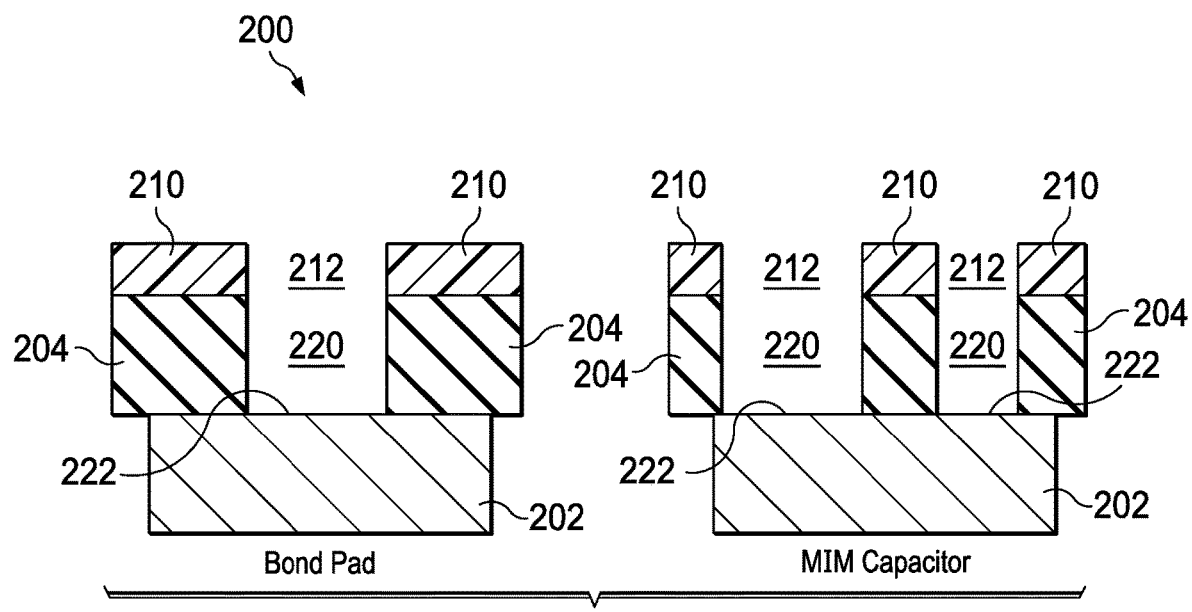

Next, as shown in FIG. 4B, a photoresist layer 210 is deposited over passivation region 204 and patterned to define openings 212. An etch is them performed through the openings 212 to define passivation region openings 220 exposing top surface areas 222 of the Cu MTOP layer 202.

Figure 4C:
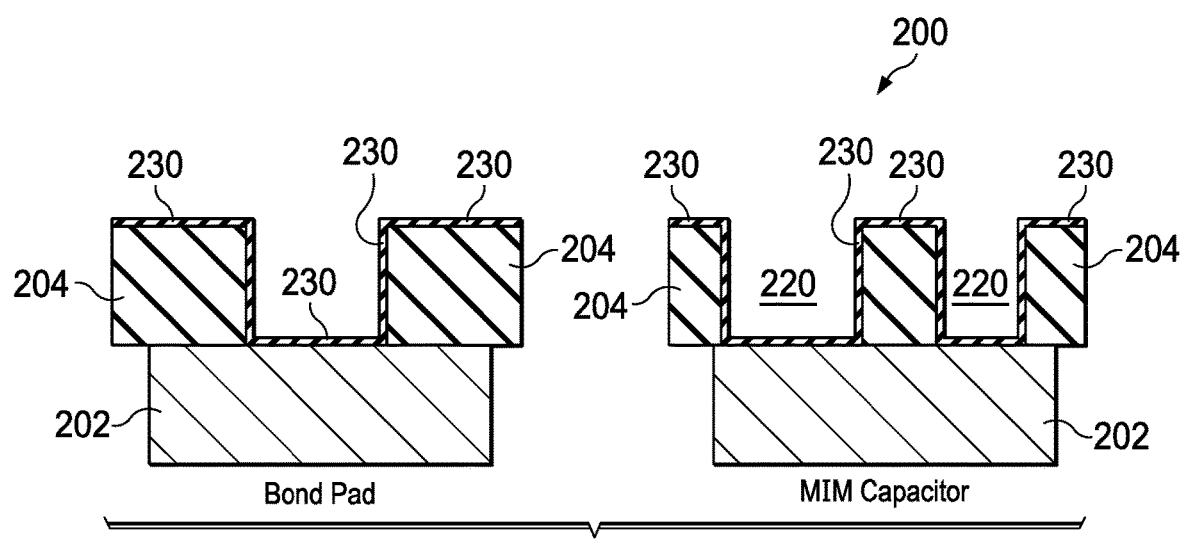

Next, as shown in FIG. 4C, a dielectric layer 230, e.g., an SiN layer, is deposited over the passivation region 204 and extending into the etched passivation openings 220 to cover the exposed top surface areas 222 (see FIG. 4B) of the Cu MTOP layer 202. The deposited dielectric layer 230 may have any suitable thickness for subsequently defining the insulator layer of the MIM capacitor being formed, e.g., a thickness in the range of 200-1000 Å, for example, 300-700 Å, for example, 400-600 Å, or about 500 Å.

Figure 4D:
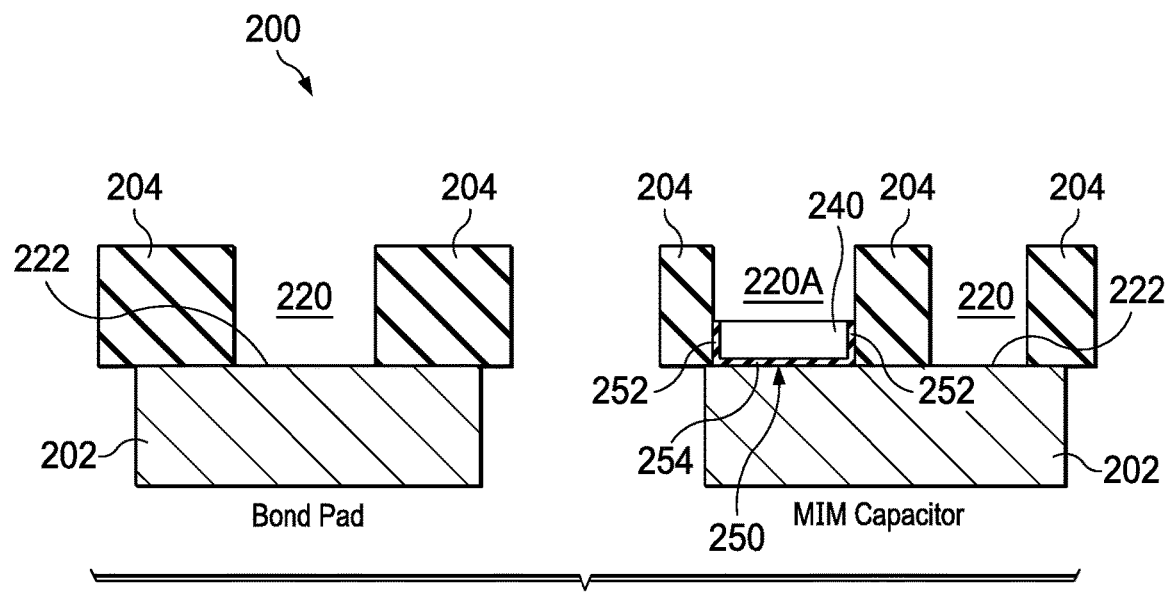

Next, as shown in FIG. 4D, selected portions of the dielectric layer 230 may be removed, leaving a portion of the dielectric layer 230 that defines a capacitor dielectric layer 250 for the MIM capacitor being formed. For example, a photoresist layer may be formed and patterned over the structure to define a photoresist region extending into a first passivation opening 220A (to partially or fully fill the first passivation opening 220A), and optionally also extending into one or more other passivation openings 220. An etch may then be performed to remove portions of the dielectric layer 230 not covered by the photoresist material, resulting in a photoresist "cap" 240 over a remaining portion of the dielectric layer 230 in the first passivation opening 220A. For example, where dielectric layer 230 comprises SiN, a nitride etch may be performed to remove portions of the SiN dielectric layer 230, thereby leaving a SiN capacitor dielectric layer 250 in the first passivation opening 220A. In some embodiments, the height of the photoresist cap 240 deposited in passivation opening 220A may be selected to prevent the etch from removing the full height of vertical sidewalls 252 extending up from the lateral bottom portion 254 of the dielectric layer 230 (laying directly on the Cu MTOP layer 202), thus leaving a remaining partial height of the vertical sidewalls 252 of dielectric layer 230, which thereby defines a cap-shaped or bowl-shaped capacitor dielectric layer 250, as shown in FIG. 4D.

Figure 4E:
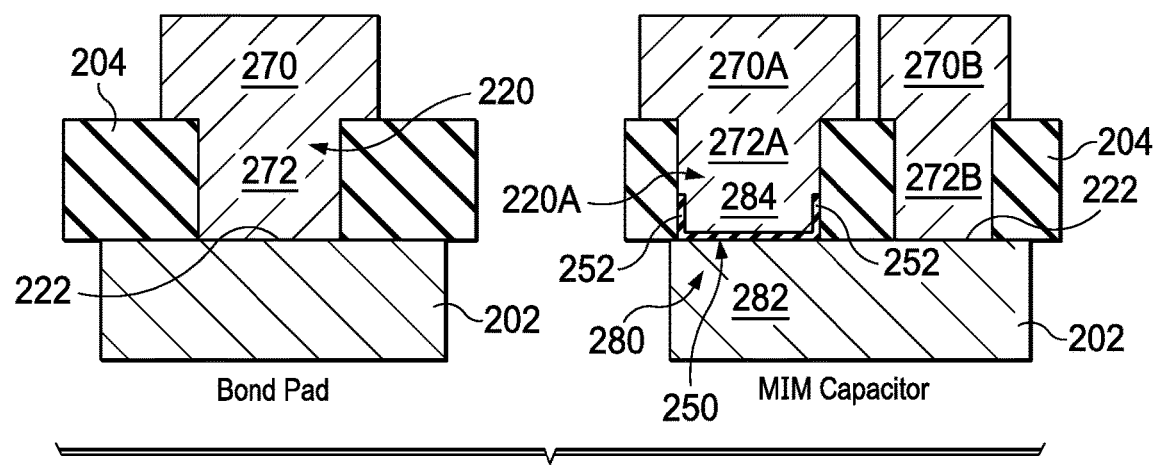

Next, as shown in FIG. 4E, the photoresist cap 240 may be removed (e.g., cleaned), and an Al bond pad layer may be deposited over the passivation region 204 and extending down into the passivation openings 220, including passivation opening 220A. A photoresist layer may be deposited and patterned over the Al bond pad layer, followed by an etch process to remove selected portions of the Al bond pad layer to define a number of Al bond pads 270 (shown respectively as Al bond pad 270, 270A and 270B), each having a contiguous region of aluminum 272 (shown respectively as contiguous region of aluminum 272, 272A and 272B) extending down into a respective passivation opening 220.

Each aluminum extension region 272 in the Bond Pad portion of structure 200 (left side of FIG. 4E) defines a direct contact between a respective Al bond pad 270 and Cu MTOP layer 202. In the MIM capacitor area, an aluminum extension region 272A extending from Al bond pad 270A into passivation opening 220A defines an MIM capacitor top plate. Thus, an MIM capacitor 280 is defined by the capacitor dielectric layer (e.g., SiN) 250 sandwiched between a bottom plate 282 defined by the Cu MTOP layer 202 and a top plate 284 defined by aluminum extension region 272A. Also, as shown in FIG. 4E, and as described above in relation to FIG. 4D, the remaining vertical sidewalls 252 extending up from the lateral bottom portion 254 of the capacitor dielectric layer 250 define "wrap-up" corners that may improve break-down voltage of the MIM capacitor 280 as a result of the corners having the highest electric field.

In order to contact the MIM capacitor 280, the top plate 284 is contiguous with Al bond pad 270A, thus defining a first contact for MIM capacitor 280. For the other contact, as shown, the bottom plate 282 (formed from Cu MTOP layer 202) may be connected to Al bond bad 270B by aluminum extension region 272B extending from Al bond pad 270B into passivation opening 220, which may define a second contact for MIM capacitor 280 at the top side of the IC structure. Alternatively, the capacitor bottom plate 282 may connect to lower level interconnect(s) or other lower level structures, e.g., as shown in FIG. 3, which may define a second contact for MIM capacitor 280 at the top side or bottom side top of the IC structure.

The invention claimed is:

1. A metal-insulator-metal (MIM) capacitor formed by a process comprising:
    forming a copper interconnect layer including a copper region defining a capacitor bottom plate of the MIM capacitor;
    forming a passivation region over the capacitor bottom plate;
    etching a top plate opening and a bottom plate opening in the passivation region thereby exposing respective top surface areas of the capacitor bottom plate;
    forming a capacitor dielectric layer extending into the top plate opening and bottom plate opening in the passivation region and onto the exposed respective top surface areas of the capacitor bottom plate; and
    depositing a bond pad metal extending over the passivation region and extending down into the top plate opening and bottom plate opening in the passivation region, wherein the bond pad metal extending into the top plate opening defines a capacitor top plate on the capacitor dielectric layer of the MIM capacitor and wherein the bond pad metal extending into the bottom plate opening defines a bottom plate contact in contact with the capacitor bottom plate; and
    etching selected portions of the bond pad metal extending over the passivation region to define (a) a top plate bond pad above and contiguous with the capacitor top plate and (b) a bottom plate contact bond pad above and contiguous with the bottom plate contact.

2. The MIM capacitor of claim 1, wherein the bond pad metal comprises aluminum.

3. The MIM capacitor of claim 1, wherein the copper interconnect layer comprises a portion of a top-most damascene copper layer of an integrated circuit device.

4. The MIM capacitor of claim 1, wherein the bond pad metal comprises aluminum, and the capacitor top plate is defined by a region of aluminum extending continuously down from the top plate bond pad and completely filling the top plate opening.

5. The MIM capacitor of claim 1, wherein each of the capacitor top plate and the capacitor bottom plate has a thickness providing a sheet resistance of less than 100 milliohms per square.

6. The MIM capacitor of claim 1, wherein the capacitor dielectric layer comprises SiN.

7. The MIM capacitor of claim 1, wherein the capacitor dielectric layer comprises a laterally-extending bottom region and at least one vertically-extending sidewall extending upwardly from at least one edge of the laterally-extending bottom region, to thereby improve a break-down voltage of the MIM capacitor.

8. The MIM capacitor of claim 1, wherein the capacitor dielectric layer comprises a laterally-extending bottom region and at least one vertically-extending sidewall extending upwardly from at least one edge of the laterally-extending bottom region, to thereby define a cup-shaped or bowl-shaped capacitor dielectric layer.

9. An integrated circuit device, comprising:
    a plurality of electronic devices;

a first metal bond pad connected to a first top metal interconnect directly by material of the first metal bond pad; and a metal-insulator-metal (MIM) capacitor formed by a process comprising:
forming a copper interconnect layer including a copper region defining a capacitor bottom plate of the MIM capacitor;
forming a passivation region over the capacitor bottom plate;
etching a top plate opening and a bottom plate opening in the passivation region thereby exposing respective top surface areas of the capacitor bottom plate;
forming a capacitor dielectric layer extending into the top plate opening and bottom plate opening in the passivation region and onto the exposed respective top surface areas of the capacitor bottom plate; and
depositing a bond pad metal extending over the passivation region and extending down into the top plate opening and bottom plate opening in the passivation region, wherein the bond pad metal extending into the top plate opening defines a capacitor top plate on the capacitor dielectric layer of the MIM capacitor and wherein the bond pad metal extending into the bottom plate opening defines a bottom plate contact in contact with the capacitor bottom plate; and
etching selected portions of the bond pad metal extending over the passivation region to define (a) a top plate bond pad above and contiguous with the capacitor top plate and (b) a bottom plate contact bond pad above and contiguous with the bottom plate contact.

10. A method of forming a metal-insulator-metal (MIM) capacitor, comprising:
forming a copper interconnect layer including a copper region defining a capacitor bottom plate of the MIM capacitor;
forming a passivation region over the capacitor bottom plate;
etching a top plate opening and a bottom plate opening in the passivation region thereby exposing respective top surface areas of the capacitor bottom plate;
forming a capacitor dielectric layer extending into the top plate opening and bottom plate opening in the passivation region and onto the exposed respective top surface areas of the capacitor bottom plate; and
depositing a bond pad metal extending over the passivation region and extending down into the top plate opening and bottom plate opening in the passivation region, wherein the bond pad metal extending into the top plate opening defines a capacitor top plate on the capacitor dielectric layer of the MIM capacitor and wherein the bond pad metal extending into the bottom plate opening defines a bottom plate contact in contact with the capacitor bottom plate; and
etching selected portions of the bond pad metal extending over the passivation region to define (a) a top plate bond pad above and contiguous with the capacitor top plate and (b) a bottom plate contact bond pad above and contiguous with the bottom plate contact.

11. The method of claim 10, wherein the capacitor top plate is defined by a region of the bond pad metal that extends continuously down from the top plate bond pad and completely fills the top plate opening.

12. The method of claim 10, wherein the bond pad metal comprises aluminum.

13. The method of claim 10, wherein forming the copper interconnect layer including the copper region defining the capacitor bottom plate of the MIM capacitor comprises forming a damascene copper layer of an integrated circuit device.

14. The method of claim 10, wherein each of the capacitor top plate and the capacitor bottom plate has a thickness providing a sheet resistance of less than 100 milliohms per square.

15. The method of claim 10, wherein the capacitor dielectric layer comprises SiN.

16. The method of claim 10, wherein:
forming the capacitor dielectric layer comprises:
forming a dielectric layer extending into the top plate opening in the passivation region and onto the capacitor bottom plate; and
removing portions of the dielectric layer to define the capacitor dielectric layer comprising a laterally-extending bottom region and at least one vertically-extending sidewall extending upwardly from at least one edge of the laterally-extending bottom region, to thereby improve a break-down voltage of the MIM capacitor.

17. The method of claim 16, wherein removing portions of the dielectric layer to define the capacitor dielectric layer comprises:
depositing a photoresist or etch stop material to cover selected portions of the dielectric layer;
performing an etch to remove portions of the dielectric layer not covered by the photoresist or etch stop material, thereby leaving a cup-shaped or bowl-shaped capacitor dielectric layer including a laterally-extending bottom region and at least one vertically-extending sidewall extending upwardly from at least one edge of the laterally-extending bottom region.

* * * * *